United States Patent
Gruen et al.

(10) Patent No.: US 6,592,839 B2
(45) Date of Patent: Jul. 15, 2003

(54) TAILORING NANOCRYSTALLINE DIAMOND FILM PROPERTIES

(75) Inventors: Dieter M. Gruen, Downers Grove, IL (US); Thomas G. McCauley, Somerville, MA (US); Dan Zhou, Orlando, FL (US); Alan R. Krauss, Naperville, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 09/255,919

(22) Filed: Feb. 23, 1999

(65) Prior Publication Data

US 2002/0114756 A1 Aug. 22, 2002

Related U.S. Application Data (63) Continuation-in-part of application No. 08/620,932, filed on Mar. 22, 1996, now Pat. No. 5,989,511, which is a continuation-in-part of application No. 08/143,866, filed on Oct. 27, 1993, now Pat. No. 5,620,512, which is a continuation-in-part of application No. 08/035,419, filed on Mar. 23, 1993, now Pat. No. 5,370,855, which is a continuation-in-part of application No. 07/797,590, filed on Nov. 25, 1991, now Pat. No. 5,209,916.

(51) Int. Cl.[7] ............................. B01J 3/06; B01J 3/08; C01B 31/06; C23C 16/26; C23C 16/32
(52) U.S. Cl. ................... 423/446; 423/266; 427/249.1
(58) Field of Search ................... 423/446, 266; 427/249.1

(56) References Cited

U.S. PATENT DOCUMENTS

| 4,816,286 A | * | 3/1989 | Hirose ........................ 427/39 |
| 4,869,924 A | * | 9/1989 | Ito ............................. 427/39 |
| 4,973,494 A | * | 11/1990 | Yamazaki .................... 427/39 |
| 5,015,494 A | * | 5/1991 | Yamazaki .................... 427/39 |
| 5,071,677 A | * | 12/1991 | Patterson et al. ........... 427/249 |
| 5,523,121 A | * | 6/1996 | Anthony et al. ............ 427/249 |
| 5,667,852 A | * | 9/1997 | Kulik et al. ................ 427/577 |
| 5,897,924 A | * | 4/1999 | Ulczynski et al. .......... 427/577 |
| D434,188 S | * | 11/2000 | Kamo et al. ................. 427/39 |

OTHER PUBLICATIONS

Effects of Noble Gas on Diamond Deposition From Methane–Hydrogen Microwave Plasmas, W. Zhu, et al., J. Appl. Phys. 68 (4), Aug. 15, 1990.

* cited by examiner

Primary Examiner—Stuart L. Hendrickson
Assistant Examiner—Jonas N. Strickland
(74) Attorney, Agent, or Firm—Emrich & Dithmar (57) ABSTRACT

A method for controlling the crystallite size and growth rate of plasma-deposited diamond films. A plasma is established at a pressure in excess of about 55 Torr with controlled concentrations of hydrogen up to about 98% by volume, of unsubstituted hydrocarbons up to about 3% by volume and an inert gas of one or more of the noble gases and nitrogen up to about 98% by volume. The volume ratio of inert gas to hydrogen is preferably maintained at greater than about 4, to deposit a diamond film on a suitable substrate. The diamond film is deposited with a predetermined crystallite size and at a predetermined growth rate.

33 Claims, 13 Drawing Sheets

TAILORING NANOCRYSTALLINE DIAMOND FILM PROPERTIES

This is a continuation-in-part of application Ser. No. 08/620,932 filed Mar. 22, 1996, U.S. Pat. No. 5,989,511 which was a continuation-in-part of application Ser. No. 08/143,866, Oct. 27, 1993, U.S. Pat. No. 5,620,512, which is a continuation-in-part of application Ser. No. 08/035,419, Mar. 23, 1993, U.S. Pat. No. 5,370,855 which is a continuation-in-part of application Ser. No. 07/797,590, Nov. 25, 1991, U.S. Pat. No. 5,209,916.

CONTRACTUAL ORIGIN OF THE INVENTION

The United States Government has rights in this invention pursuant to Contract No. W-31-109-ENG-38 between the U.S. Department of Energy and The University of Chicago representing Argonne National Laboratory.

BACKGROUND OF THE INVENTION

Polycrystalline diamond films whose microstructure typically consist of crystallites with sizes on the order of microns have been synthesized by a variety of chemical vapor deposition (CVD) techniques from methane-hydrogen mixtures. Atomic hydrogen has been recognized to play a crucial role in the growth of phase-pure microcrystalline diamond films by the CVD techniques, typically using hydrocarbons as the carbon source. Atomic hydrogen is thought to play a number of roles including abstraction reactions, termination of carbon dangling bonds, and regasification of nondiamond materials at the growth surface. Reducing the concentration of hydrogen while continually increasing the hydrocarbon content of the plasma normally causes the growth of non-diamond phases and eventually the complete absence of the diamond phase. The grain size, surface morphology, and surface roughness of the polycrystalline diamond films prepared from hydrogen-rich plasmas depend strongly on the film thickness. Generally, the thicker the film, the larger the grain size and the rougher the surface of the film. This behavior is generally ascribed to growth competition between differently oriented grains, with grain growth in turn being strongly correlated with surface roughness as discussed in more detail below. Many applications of CVD diamond films, however, require smooth surfaces, which are not readily prepared from hydrogen-rich plasmas. The ability to control the microstructure and the surface morphology of diamond films, therefore, could be important for tailoring this unique material to a variety of applications.

It has been found that a number of properties, including surface morphology and crystal orientation of microcrystalline diamond films, depend on a variety of factors such as the nucleation process and film deposition conditions. Microcrystalline diamond films grown from randomly oriented nuclei exhibit columnar growth, which is caused by an "evolutionary selection" of crystallites. Because crystals with a direction of fastest growth more or less perpendicular to the substrate grow at the expense of less favorably oriented ones, only a few crystallites survive, and a highly textured film consisting of larger, columnar crystallites is formed after a longer period of growth. The grain size therefore increases with the thickness of the films, and usually the larger the grains the rougher the surface of the films. Therefore, if it were possible to reduce the grain size in a controlled way, smoother surfaces should result.

In order to understand and control surface morphology and crystal orientation, both the nucleation and deposition processes have been investigated extensively. It has been found that diamond films can be grown with a preferred orientation, such as (111) or (110), by precisely controlling the prenucleation treatments and the deposition process parameters. Moreover, it has been recognized that nitrogen and oxygen additions in the plasmas have a strong effect on the growth morphology of diamond films. It is known that to increase the electron density of the plasma and to modify diamond film morphology, argon has been added to plasmas. Argon has also been used in place of hydrogen in a carbon-oxygen-argon system, but oxygen was found to be a critical parameter for the phase purity of the deposited diamond films. Furthermore, in a microwave methane-hydrogen plasma, noble gases were found to have a profound effect on plasma chemistry, including additional ionization and dissociation. Upon adding a noble gas such as Ar, the emission intensity of various species changes and the growth rate of diamond is enhanced. However, the effect of Ar addition to the microwave discharges, and thus the microstructures of the deposited films at concentrations higher than about 30 vol. % heretofore were unknown.

Recently, it has been reported that nanocrystalline diamond films can be grown from an Ar—$C_{60}$ microwave plasma without adding molecular hydrogen to the reactant gas. Fullerenes such as $C_{60}$ and $C_{70}$ have been used as the carbon source for nanocrystalline diamond growth. Fragmentation of the fullerenes in the plasma results in strong Swan band emission due to $C_2$ radicals. The $C_2$ dimer appears to be the growth species for nanocrystalline diamond. Furthermore, nanocrystalline diamond films have also been synthesized from Ar/$CH_4$ microwave discharges, without the addition of molecular hydrogen. Atomic force microscopy (AFM) shows that the surface roughness is in the range of 20–50 nm, independent of the film thickness, thus suggesting that grain size remains in the nanometer range. Some of the unique properties of such nanocrystalline films have been characterized, including their tribiological and electron field emission properties.

The present invention relates to a method that allows control of the microstructure of diamond films grown from Ar/$H_2$/$CH_4$ plasmas. Some of the factors leading to a transition from microcrystalline to nanocrystalline diamond have been determined. The as-grown films produced from Ar/$H_2$/$CH_4$ plasmas with different ratios of Ar to $H_2$ have been characterized by scanning electron microscopy (SEM), micro-Raman spectroscopy, transmission electron microscopy (TEM), x-ray diffraction (XRD), and AFM.

SUMMARY OF THE INVENTION

An object of the present invention is to provide a method for controlling the crystallite size of plasma-deposited diamond films with a plasma consisting of hydrogen, inert gas and a hydrocarbon.

Yet another object of the invention is to provide a method of controlling the crystallite size of a plasma-deposited diamond film wherein a three-part plasma of hydrogen, hydrocarbon and inert gas contains at least 40% by volume inert gas.

Yet another object of the present invention is to provide a method of depositing a nanocrystalline diamond film from a three part plasma wherein the ratio of inert gas to hydrogen is not less than 4 and preferably not less than about 9.

Another object of the invention is to provide a method of controlling the growth rate of plasma-deposited diamond films from a three part plasma wherein the pressure of the plasma is maintained between about 55 and about 150 Torr during deposition.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

FIG. 2b is film V; FIG. 2c is film VI; and FIG. 2d is film VII;

DESCRIPTION OF THE PREFERRED EMBODIMENT

As used herein, plasma means any plasma wherein energy is imparted to a gas mixture by any of the usual forms of forming a plasma. A DC arc, an RF discharge, a plasma jet or a microwave may be used as energy sources to create the plasma hereinafter described. For purposes of simplicity only, a microwave has been used to describe the plasma source in the following specification but it is for brevity and not to limit the scope of the invention;

Similarly, the use of any hydrocarbon which consists fundamentally of carbon and hydrogen without added oxygen, chlorine or other elements may be used. For purposes of simplicity, methane has been illustrated but it is clear that various $C_{70}$ buckyballs may be also used as may $C_{60}$ fullerene, as is well known in the art. The reference to hydrocarbon hereafter refers to any hydrocarbon which may be suitable for the deposition of diamond films.

Similarly, the third component of the plasma in the subject invention is an inert gas. For purposes of simplicity, argon has been used as the inert gas but it is understood by those of ordinary skill in the art that any of the noble gases as well as nitrogen or any mixtures of the noble gases and nitrogen may be used in lieu of argon as an inert gas. Where argon is used in the specification hereafter, it is for purposes of illustration only and not for purposes of limitation.

It is true that the method of the present invention permits controlling the crystal size of plasma-deposited diamond films from about 3 nm to about 10 microns. For many uses, crystallite sizes in nanometer ranges are preferred; however, to the extent that crystallite sizes in the micron size are desired, the inventive method is capable of being used to produce crystallites of micron size.

The invention also includes process steps for controlling the growth rate of the diamond film deposited by means of plasma. It is understood from the specification as hereinafter set forth that pressures lower than about 55 Torr do not result in significant crystallite growth although crystallite growth has been observed as low as about 40 Torr. Pressures as great as 150 Torr may be used to deposit films in a rapid manner, all as set forth in FIG. 12 and discussed hereinafter.

A microwave plasma enhanced CVD system (ASTeX PDS-17) has been employed for the diamond film preparations. Mixtures of $CH_4$, Ar, and $H_2$ have been used as the reactant gases for the microwave discharges. The flow rate of $CH_4$ was kept constant at 1 sccm and supplemented by $H_2$ so as to maintain a 100 sccm total flow rate. n-type single crystal silicon wafers with an <100> orientation were used as the substrates, and mechanical polishing with fine diamond powder (0.1 $\mu m$) was employed to provide nucleation sites for the diamond film growth. It is understood, however, that any suitable substrate may be used on which to deposit diamond films, as is well know in the art. During the deposition process, the substrate temperature, which was controlled by a separate heater, was maintained at 800° C., while total ambient pressure and input power were kept at 100 Torr and 1200 W, respectively. The reactant gases used for each film deposition are listed in Table I. To investigate the effect of the concentration of the $C_2$ dimer on the growth rate at a given $Ar/H_2$ ratio, the total pressure of the reactant gas ($CH_4/Ar$) was varied from 40 to 150 Torr.

TABLE I

Summary of the reactant gases used for diamond film depositions from microwave discharges.

| Sample No. | Reactant gas (vol %) | | |
|---|---|---|---|
| | Argon | Hydrogen | Methane |
| I | 2 | 97 | 1 |
| II | 20 | 79 | 1 |
| III | 40 | 59 | 1 |
| IV | 60 | 39 | 1 |
| V | 80 | 19 | 1 |
| VI | 90 | 9 | 1 |
| VII | 97 | 2 | 1 |
| VIII | 99 | 0 | 1 |

In order to obtain some information on plasma species during the deposition process, optical emission was measured using a spectrometer equipped with a 1200 grooves/mm grating and a water-cooled photomultiplier tube (Interactive Technology). The concentration of $C_2$ dimers could be determined from the emission spectra because it was found in earlier work that emission is linearly correlated with quantitative absorption measurements. Emission from the plasma was collected with a quartz optical fiber viewing a region 1-2 cm above the substrate. The monochromater was stepped in 2.0 Å increments with a dwell time of 100 ms from 3000 to 7000 Å. The emission intensity of $C_2$ was measured from the $C_2$ Swan system at 5165 Å. The growth rates of diamond thin films deposited from the $Ar/H_2/CH_4$ plasmas were determined by monitoring modulations of the surface reflectivity versus deposition time with a He-Ne laser (6328 Å) reflectance interferometer during the deposition process. One peak-to-peak modulation represents 130 nm, and depositions were carried out until film thicknesses of about 5 µm were obtained.

The as-grown films were then investigated using a JEOL 840A SEM with a tungsten filament operating at 10 KV accelerating voltage and a probe current of $3 \times 10^{-11}$ A. Both plan-view and cross-section SEM images were obtained to examine the surface and growth morphologies as a function of added Ar. A high-resolution JEOL 4000EX TEM operated at 400 kV accelerating voltage and a Philips CM 30 analytical TEM equipped with a Gatan electron energy loss spectroscopy (EELS) spectrometer were employed for detailed microstructural characterization of selected films. The planview TEM samples were prepared by the conventional methods, i.e., mechanical cutting, shaping, dimpling, and ion milling. In order to confirm the crystalline structure of the films, x-ray diffraction was conducted by using a Philips x-ray spectrometer with a copper $K_\alpha$ target. The starting and ending angles (2θ) for the x-ray diffraction are 20° and 120°, respectively. A Renishaw Raman Microscope (System 2000), which can capture both Raman spectra and images, was used for further characterization of the as-grown films. The light source for illuminating the sample was provided by a He-Ne laser (6328 Å). Raman spectra and images were obtained via a grating or filter system. The Raman scattering produced by a sample was measured by a charge-coupled device (CCD) camera. To obtain the planography and the surface roughness of the as-grown films, a Burleigh ARIS-3300 personal AFM with image resolution of x-y axes<30 Å and z axis<3 Å was used. The true image software managed the secondary signals sent to the electronic controller and displayed the resulting images in close to real time.

Figure 1:
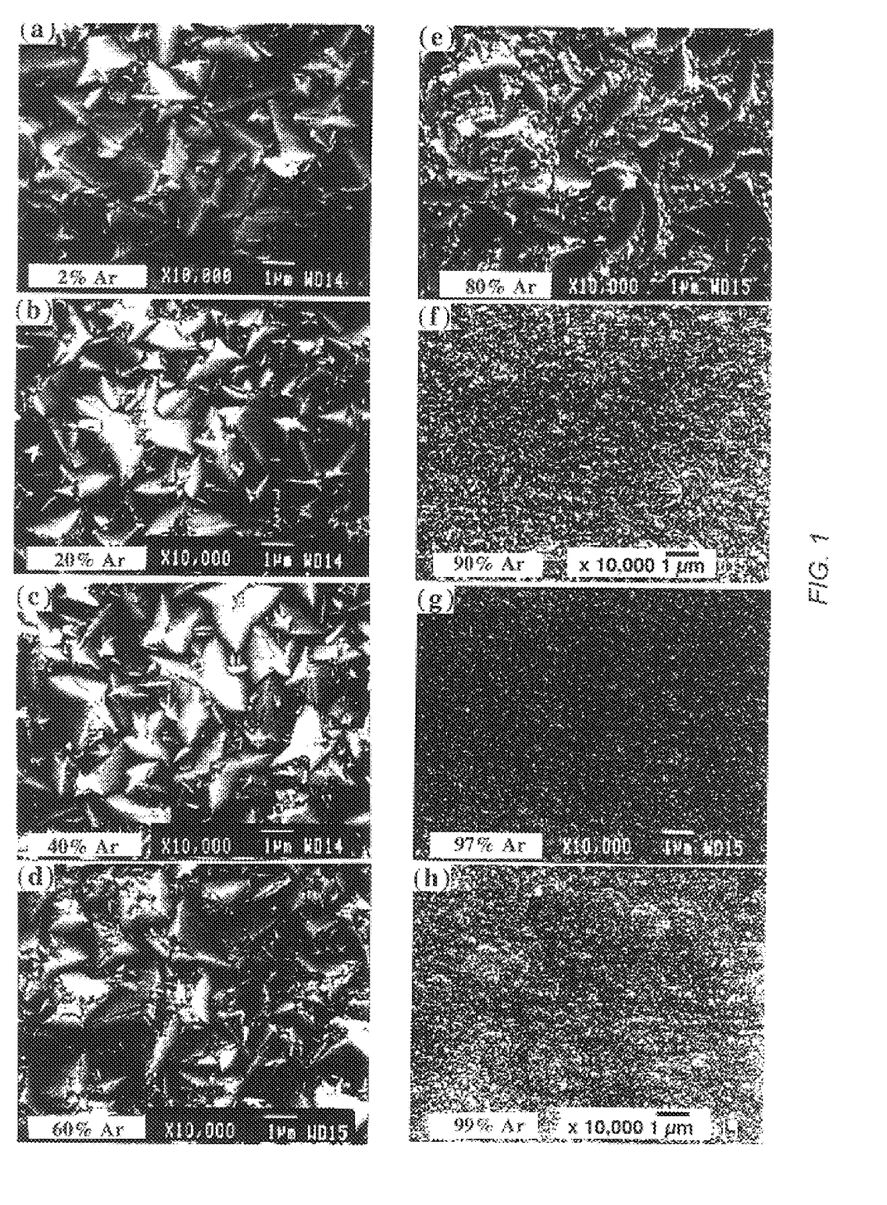
FIG. 1 is a plan view of the SEM images of the as-grown films prepared from microwave plasmas with various mixtures of Ar, $H_2$ and $CH_4$ listed in Table 1 hereafter corresponding (a) film I, (b) film II, (c) film III, (d) film IV; (e) film V; (f) film VI; (g) film VII; and (h) film VIII reported in Table 1.

The as-grown films were first examined by SEM in order to obtain the surface and growth morphologies as a function of added Ar. The plan-view SEM images shown in FIG. 1 demonstrate a dramatic change in the surface morphology of the films when adding Ar gas to the $H_2/CH_4$ microwave plasma. FIG. 1(a) shows the surface morphology of film I, displaying a well-facetted microcrystalline diamond surface with grain sizes ranging from 0.5 to 2.0 µm. The surface is very rough and consists of a combination of {111} and {110} facets. This SEM image suggests that the crystallite morphology of film I is independent of crystal orientation and that secondary nucleation rates must be very low. A plan-view SEM image of film II [FIG. 1(b)] shows that {111} planes are still the preferred growth planes, but small diamond particles start to form on the surface of bigger diamond grains during the deposition process, suggesting that secondary nucleation or renucleation occurs when 20% of Ar gas has been added to the microwave plasma. The number density of the small crystals increases significantly at the level of 40 to 60 volume % Ar [FIGS. 1(c) and 1(d) for films III and IV]. Note that these SEM images also show that most of the small diamond crystals nucleate and grow at the edges (twin boundaries) of larger diamond crystals. At 80 volume % Ar, the edges or the twins of the large-size diamond crystals begin to disappear, and well-facetted {111} as well as {110} diamond crystallites of micron size no longer exist, while small diamond crystals mixed with large diamond flakes are found in the plan-view SEM image {FIG. 1(e) for film V}. When 90 volume % Ar is added to the $Ar/H_2/CH_4$ plasma, the crystal sizes are greatly reduced to the nanometer scale, and the surface structure of the diamond film {FIG. 1(f) for film VI} changes from microcrystalline to nanocrystalline. At this point, facetted micron-size diamond has disappeared, and nanocrystalline diamond begins to predominate. FIGS. 1(g) and 1(h) show the plan-view images of films VII and VIII, respectively, revealing that the crystal sizes of the nanocrystalline diamond can be further reduced when the plasma consists of 97% Ar (FIG. 1(g)) or 99% Ar {FIG. 1(h)}. In the latter case, the film was grown in the absence of added hydrogen.

Figure 2:
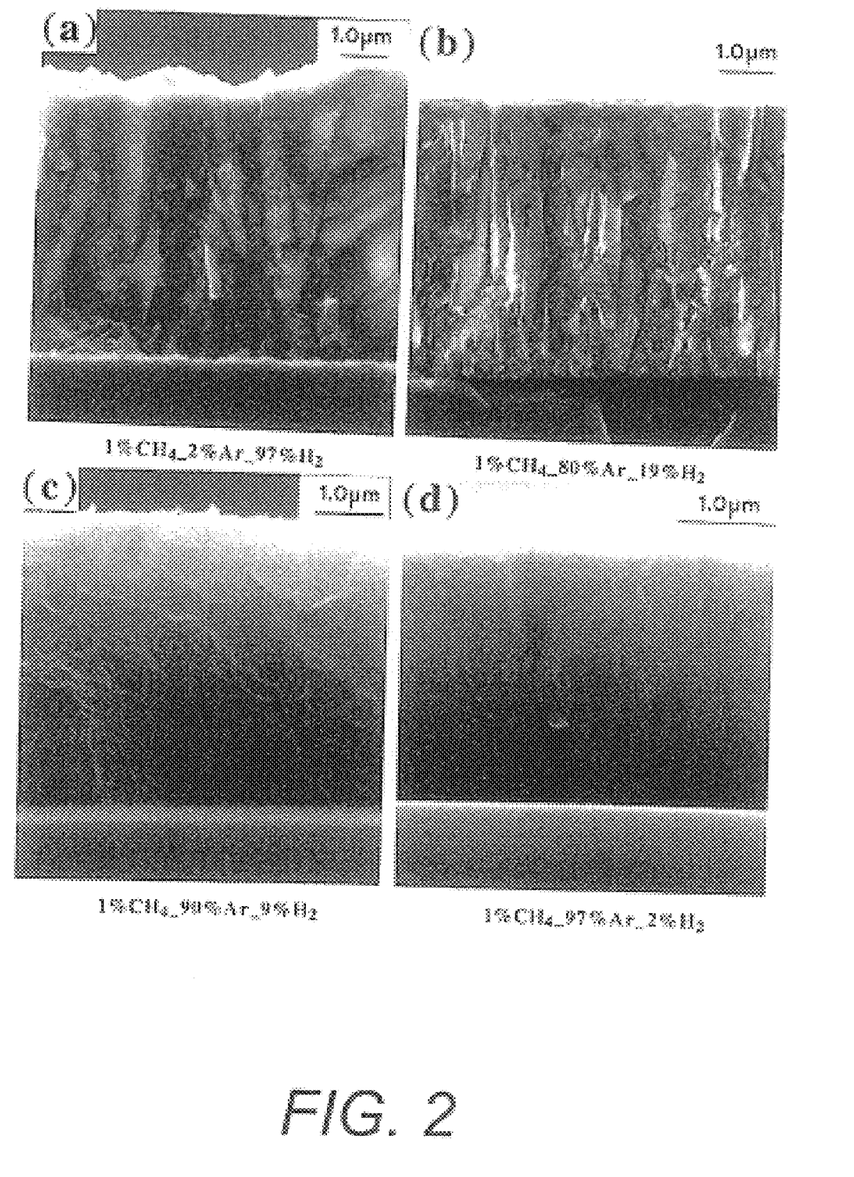
FIG. 2 is a cross-section SEM image of the as-grown films with FIG. 2(a) being film I.

This series of SEM micrographs demonstrates the transition of the microstructure of the films from microcrystalline to nanocrystalline diamond. In order to obtain information on the development of the growth morphology, films I, V, VI, and VII were selected for further investigation by cross-section SEM. FIG. 2(a) shows the cross-section SEM image of film I with a columnar growth structure, which is typical of the growth morphology from $H_2/CH_4$ plasmas and reflects the van der Drift growth mechanism. This columnar growth phenomenon suggests that atomic hydrogen plays an important role in suppressing secondary nucleation by regasifying small or nondiamond phase nuclei. Thus, only a few larger diamond crystals of micron size survive after a longer period of growth. The greater the Ar content of the microwave plasma, the greater the fraction of small diamond crystals. FIG. 2(b) shows the cross-section SEM image of the as-grown diamond film V, displaying that the film still has columnar growth, but the columns are much narrower than those in film I. As the Ar volume fraction increases to 90 or 97 volume %, the columnar structure totally disappears from the cross-section SEM images of films VII and VIII [see FIGS. 2(c) and 2(d)]. Instead, the cross-sectional views show smooth fracture surfaces, which suggests that the nanocrystalline diamond does not grow from the initial nuclei at the substrate film interface, but is the result of very high renucleation rates. The cross-section SEM images clearly show columnar growth, which gives way to highly dense continuous films with no distinctive growth morphology. The lack of morphological features is probably due to the fact that the crystallites are too small to be resolved in the SEM.

Figure 3:
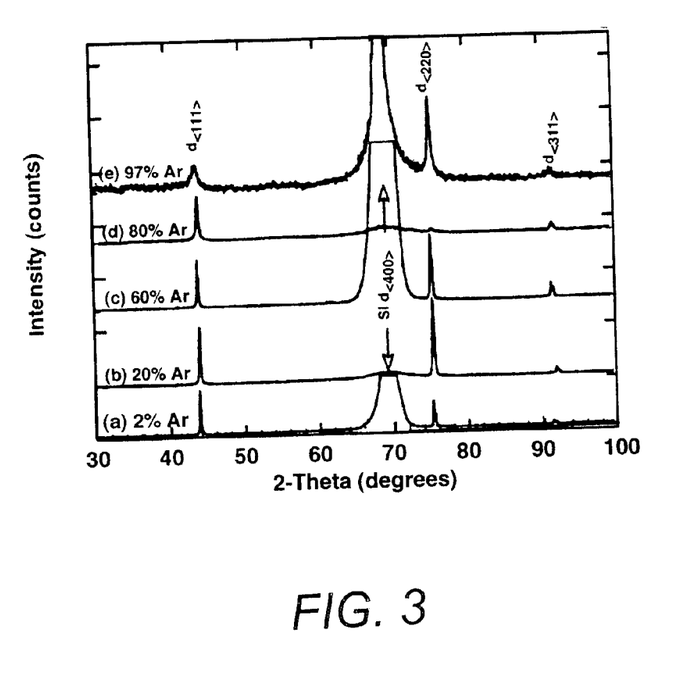
FIG. 3 shows the Raman spectra of the as-grown films deposited from $Ar/H_2/CH_4$ microwave plasmas with different reactant gases which show that the Raman scattering is strongly influenced by grain size; whereas (a) is film I; (b) is film II; (c) is film IV; (d) is film V; (e) is film VI.

X-ray powder diffraction has been used to characterize the crystalline structures of the films. FIG. 3 shows the x-ray diffraction of films I, II, IV, V and VI. The diffraction peaks can be indexed according to the cubic diamond structure, which means that all the films produced from either hydrogen-rich or argon-domain microwave plasmas consist of diamond crystals. The diffraction spectra show that with increasing volume percent of Ar, the widths at half height of the diffraction peaks increase significantly, which may be correlated with decreasing grain sizes. There is no evidence for the presence of graphitic or amorphous carbon in the x-ray diffraction patterns of both microdiamond and nanodiamond films. The ratio of the (111) to the (110) diffraction peak [see FIGS. 3(a)–3(e)] increases greatly with increasing ratio of Ar to $H_2$, indicating that the diamond grains tend to orient with the crystallographic planes parallel to the substrate surface when their sizes change to the nanometer scale. The silicon diffraction peak from Si planes derives from the substrate used for the film depositions.

Figure 4:
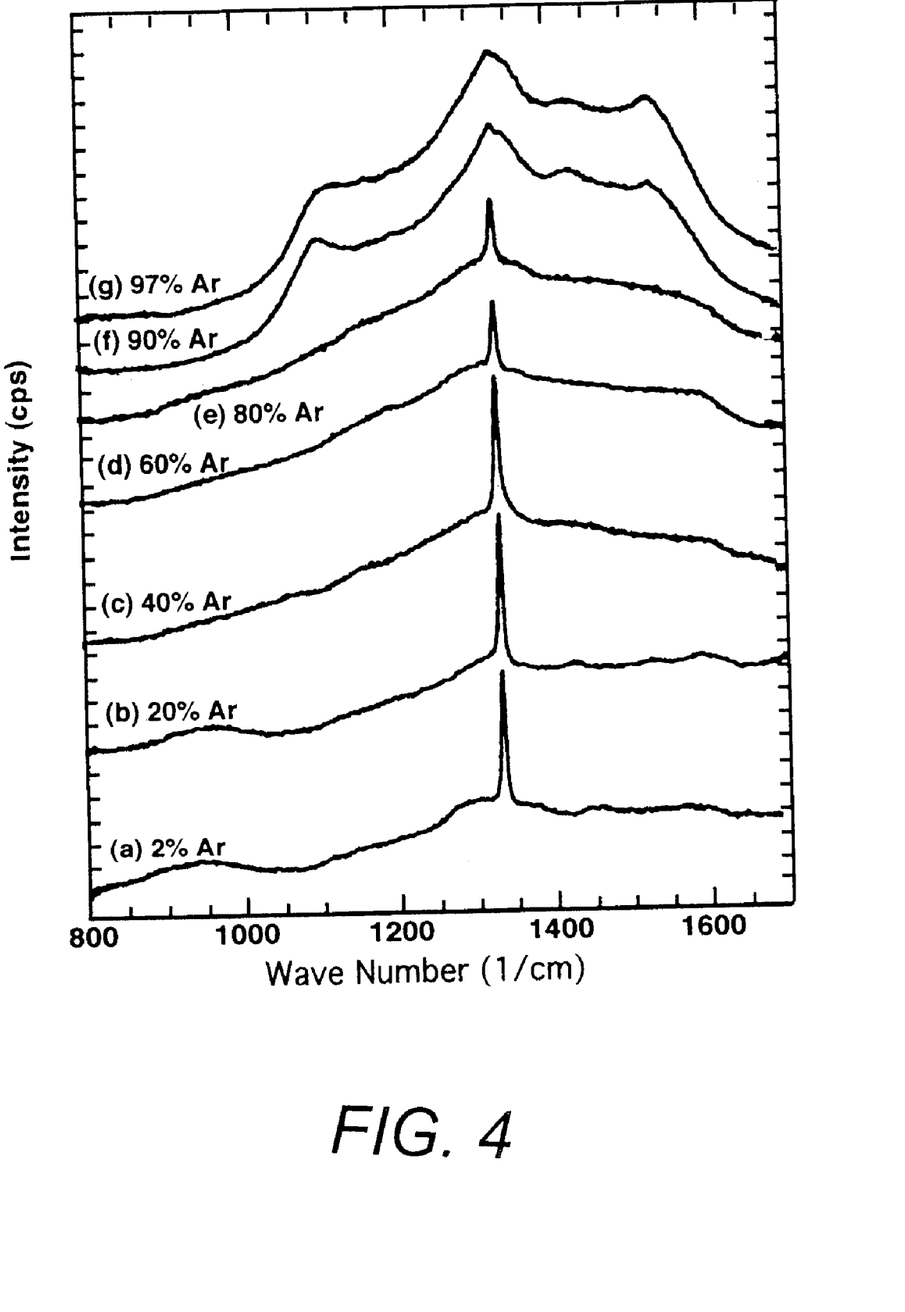
FIG. 4 shows the x-ray diffraction patterns of the as-grown films deposited from microwave plasmas with different mixtures of Ar, $H_2$ and $CH_4$ as the reactant gases showing that the films consist of crystalline diamond. The diffraction peaks broaden with increasing concentration of Ar due to decreasing grain size; (a) is film I; (b) is film II; (c) is film III; (d) is film IV and (e) is film V (f) is film VI and (g) is film VII.

X-ray electron diffractions are sensitive to the presence of crystalline carbons such as diamond or graphite but less sensitive to amorphous carbon. In contrast, Raman scattering is about 50 times more sensitive to $\pi$-bonded amorphous carbon and graphite than to the phonon band of diamond, and hence it is frequently used to characterize CVD diamond films. FIG. 4 shows the plots of Raman spectra of the as-grown films produced from $Ar/H_2/CH_4$ microwave plasmas with different ratios of $Ar/H_2$ in the reactant gases, revealing the transition from microcrystalline to nanocrystalline diamond films. For film I, grown from the $Ar/H_2/CH_4$ microwave plasma with 2 volume % Ar addition, the spectrum shows a sharp Raman band at 1332 $cm^{-1}$, characteristic of diamond. Little Raman scattering in the range 1450–1490 $cm^{-1}$ (graphite band) caused by carbon $sp^2$ bonded carbon is observed. When adding argon to the reactant gas up to 40 volume %, the Raman spectra of films II and III still demonstrate the presence primarily of microcrystalline diamond, although the spectra are slightly broadened. Further increasing the concentration of Ar in the plasmas results in the shrinking of the diamond band and increasing its width at full width half maximum (FWHM) (see spectra for the films IV and V). When more than 90 volume % of Ar is added to the plasma, Raman spectra of the films VI and VII typically show nanocrystalline features. The diamond band at 1332 $cm^{-1}$ is significantly broadened, and Raman scattering intensity in the 1400–1600 $cm^{-1}$ region is pronounced. It has been shown that broadening of the diamond band is caused by decreasing the grain size to the nanometer scale, and the development of the "so called graphite" band is due to increasing $\pi$-bonded carbon at the grain boundaries in the nanocrystalline films. The grain boundaries consist of carbon atoms with a $sp^2$ electron configuration. In addition to the diamond and graphite bands, the spectra also have an extra Raman shift around 1150 $cm^{-1}$, which may be caused by nanocrystalline diamond. Therefore, in addition to SEM images and x-ray diffraction, Raman spectra of the as-grown films further confirm the transition of microdiamond to nanodiamond prepared from microwave plasmas as argon is added to $CH_4H_2$ mixtures. Nanocrystalline defines a size range such that when the volume ratio of Ar to $H_2$ is about 4, the crystal structure is classified nanocrystalline but is the largest of the nanocrystalline material. When the volume ratio of Ar to $H_2$ is about 9, the nanocrystalline structure contains smaller material.

Figure 5A:
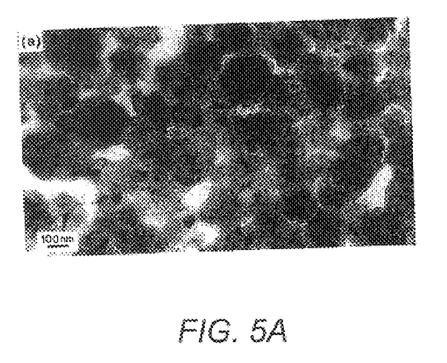
FIG. 5 is a plan-view TEM image of nanocrystalline diamond films produced from $Ar/H_2/CH_4$ microwave discharges showing the effect of the concentration of Ar or $H_2$ on the grain size: (a) is film VI with grain sizes ranging from 30 to 50 nm; (b) is film VII with grain sizes in the range of 10–30 nm.
Figure 5B:
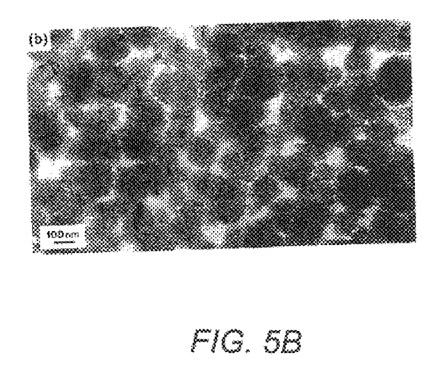
Figure 6A:
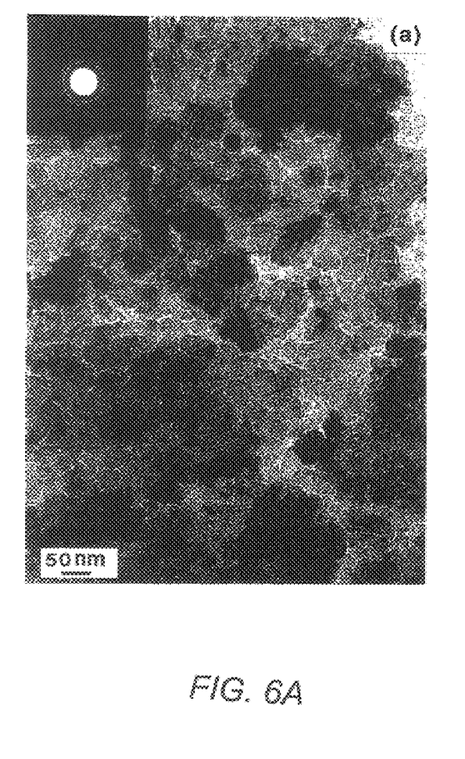
FIG. 6 shows (a) A plan-view TEM image of diamond film (VIII) produced from 1% $CH_4$+99% Ar composition, demonstrating that the film consists of very small grains ranging from 30 to 25 nm (b) a high-resolution lattice fringe TEM image of the film, (c) electron energy loss spectrum of the film from an area over 10 $\mu m$ in diameter showing the $\sigma^*$ edge. The insert images show the selected area electron diffraction patterns of the film.
Figure 6B:
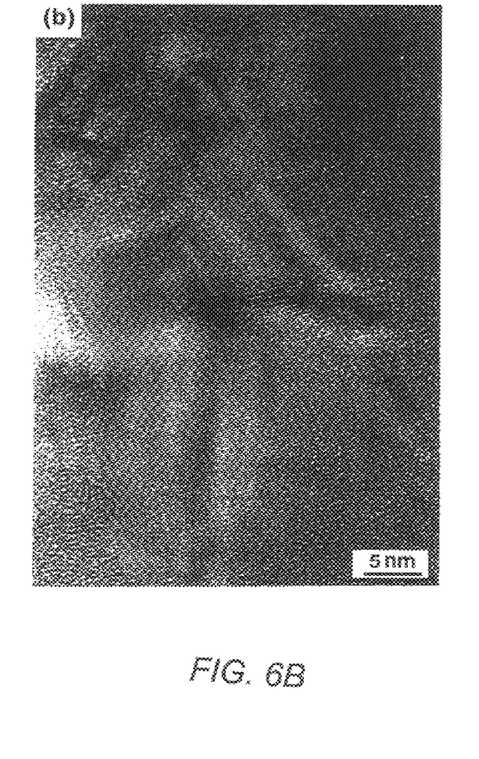
Figure 6C:
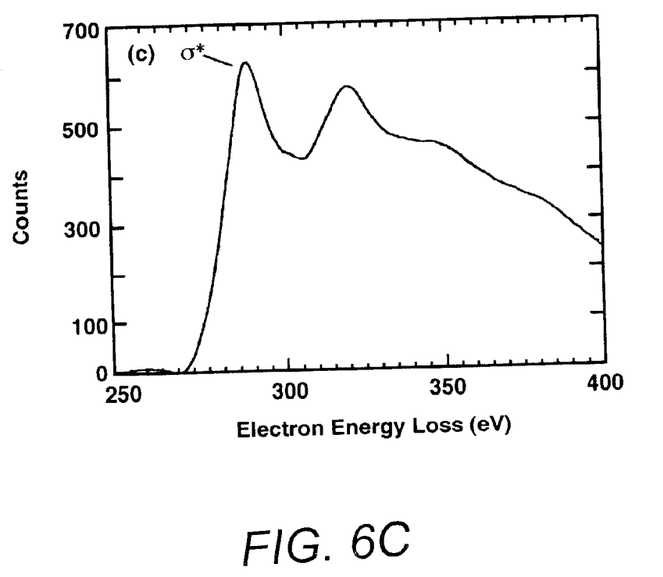

A powerful way to study the effect of added Ar on grain size with TEM. Examples of the application of this technique to the present study are given below. FIG. 5(a) shows a plan-view TEM image of film VI (90 volume % Ar) with grain sizes ranging from 30 to 50 nm. However, film VII (97 volume % Ar) has grain sizes in the range of 10–30 nm (FIG. 5(b)). Thus, the grain size of the nanocrystalline diamond decreases strongly in the range 90–97 volume % Ar. Further characterization of the nanocrystalline film VIII (99 volume % Ar) has been conducted by high resolution TEM and EELS observations. FIG. 6(a) shows a plan-view TEM image of film VIII with grain sizes ranging from 3 to 20 nm. The inset image is a selected area (over 10 $\mu$m in diameter) electron diffraction pattern, which can be fully indexed on the diamond structure. A high-resolution TEM image shown in FIG. 6(b) demonstrates that individual grains are single crystals with sizes in the 10–20 nm range. The image of lattice fringes has a spacing of 0.205 nm, which is the interplanar distance between diamond planes {111}. The lattice image of diamond can only be observed on planes and only when they are properly oriented, since the TEM resolution is about 1.8 Å EELS has been employed as a diagnostic for amorphous or disordered carbon with $sp^2$ bonding. It is known that the different carbon phases have very distinct K-shell absorption edge structures. Diamond has a single EELS feature with an onset at 289 eV, due to its $\sigma^*$ electronic state, while graphitic or amorphous carbon has an additional EELS edge starting at 284 eV, owing to its lower lying antibonding $\pi^*$ state. (The use of an asterisk denotes an excited state) FIG. 6(c) shows an EELS spectrum of the nanocrystalline diamond film produced from an $Ar/CH_4$ plasma acquired over an area ~10 $\mu$m in diameter, displaying only an EELS edge at 289 eV, characteristic of diamond. No energy loss feature at 284 eV has been observed, demonstrating the absence of an amorphous or graphitic phase in the film. These TEM analyses (plan-view and high resolution TEM images as well as the EELS spectrum) confirm that film VIII prepared from an $Ar/CH_4$ microwave discharge without any $H_2$ addition is composed of nanocrystalline diamond.

Figure 7A:
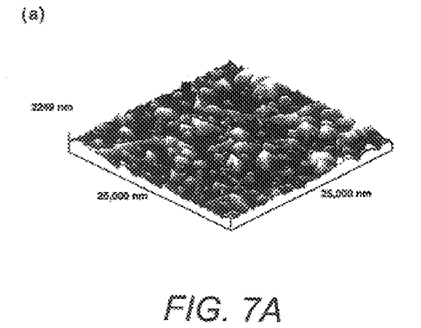
FIG. 7 shows a three-dimensional AFM images of the as-grown diamond films deposited from $Ar/H_2/CH_4$ microwave plasmas with different reactant gases showing the effects of increasing the ration of Ar to $H_2$ in the reactant gas on the surface morphology and surface roughness of the as-grown films: (a) film I; (b) film IV; (c) film VI; and (d) film VII.
Figure 7B:
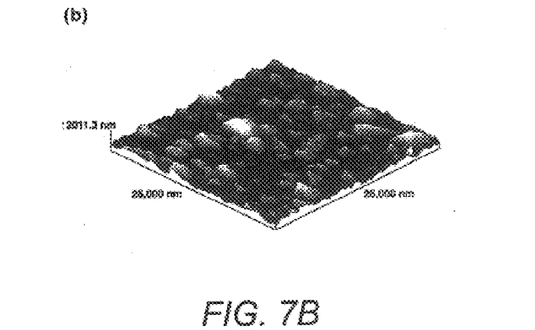
Figure 7C:
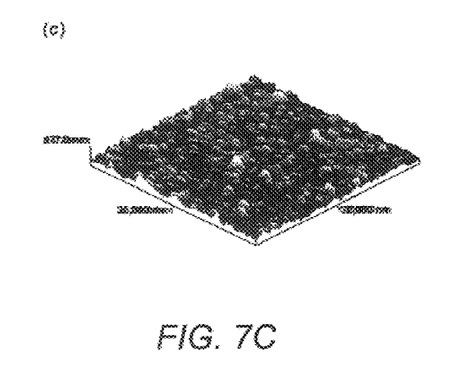
Figure 7D:
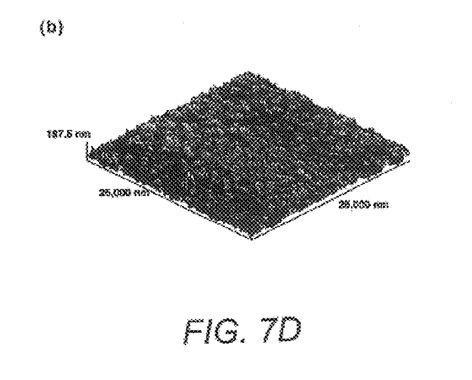
Figure 8:
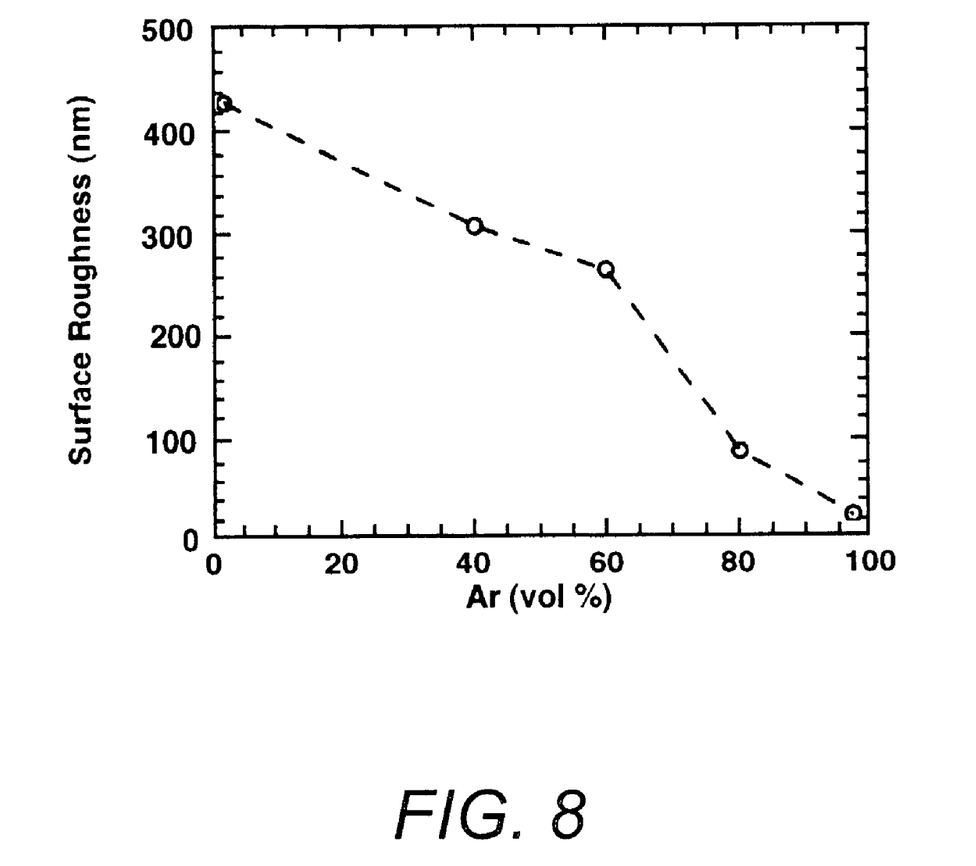
FIG. 8 is a plot of the surface roughness of the as-grown diamond films versus the concentration of Ar in the $Ar/H_2/CH_4$ microwave plasmas.

To obtain information on planigraphy and surface roughness, AFM has been employed. Note that all of the films for the AFM analyses have similar thicknesses of about 5 $\mu$m. FIG. 7(a) shows a three-dimensional AFM image of film I (2 volume % Ar) with an rms (root mean square) surface roughness of about 425.43 nm. Addition of Ar up to 60 volume % decreases the rms roughness of III to 262.876 nm, because this film consists of a significant amount of small diamond particles (FIG. 7b). When Ar in the plasma is further increased, the surface roughness of film VI (90 volume % Ar) is greatly reduced to 54.19 nm (FIG. 7c). With a reactant gas mixture of 97 volume % Ar, 2 volume % $H_2$, and 1 volume % $CH_4$, the AFM image shown in FIG. 7(d) reveals that the surface roughness of film VII is just 18.84 nm, a typical value for our nanocrystalline diamond films. Note that the rms roughness of film VII is about 25 times smaller than that of microcrystalline diamond film I. The detailed surface analytical data acquired by AFM characterization for films I, III, VI, and VII are listed in Table II, where Z-rms is the root mean square of the surface, Z-var is the average height of the surface, and Z-peak is the height difference between the highest and lowest points on the surface. A plot of the surface roughness of the films versus the concentration of Ar in the reactant gas is shown in FIG. 8. A plot of, the data suggests an almost linear relationship between surface roughness of the films and volume % Ar. Since the ratio of Ar to $H_2$ in the reactant gas strongly affects the surface morphology and microstructure of the diamond films, this parameter can clearly be very useful in tailoring important properties of this material.

TABLE II

Summary of the surface morphologies of selected diamond films, measured by AFM. Z-rms is the root means square of the surface; Z-var is the average height of the surface; Z-peak is the height difference between the highest and lowest points on the surface.

| Sample No. | Z-avg (nm) | Z-rms (nm) | Z-var (nm) | Z-peak (nm) |
|---|---|---|---|---|
| I | 1215.94 | 425.43 | 390.03 | 2249.02 |
| IV | 722.01 | 262.76 | 206.29 | 2011.31 |
| VI | 176.07 | 54.19 | 42.47 | 477.81 |
| VII | 58.38 | 18.84 | 14.84 | 187.51 |

Figure 9A:
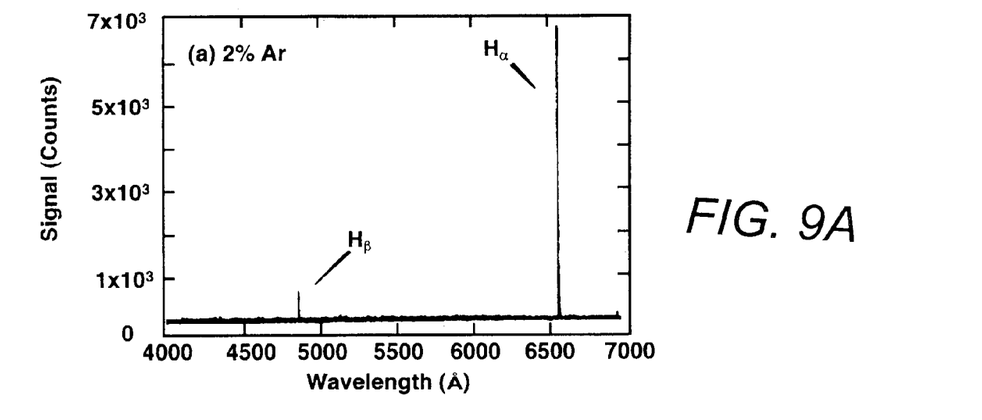
FIG. 9 shows the optical emission spectra of the $Ar/H_2/CH_4$ microwave plasmas with different mixtures of Ar, $H_2$ and $CH_4$ in the reactant gases: (a) 2% Ar+97% $H_2$+1% $CH_4$; (b) 20% Ar+69% $H_2$+1% $CH_4$; (c) 60% Ar+39% $H_2$+1% $CH_4$; (d) 80% Ar+19% $H_2$+1% $CH_4$; (e) 90% Ar+99% $H_2$+1% $CH_4$; (f) 97% Ar+2% $H_2$+1% $CH_4$.
Figure 9B:
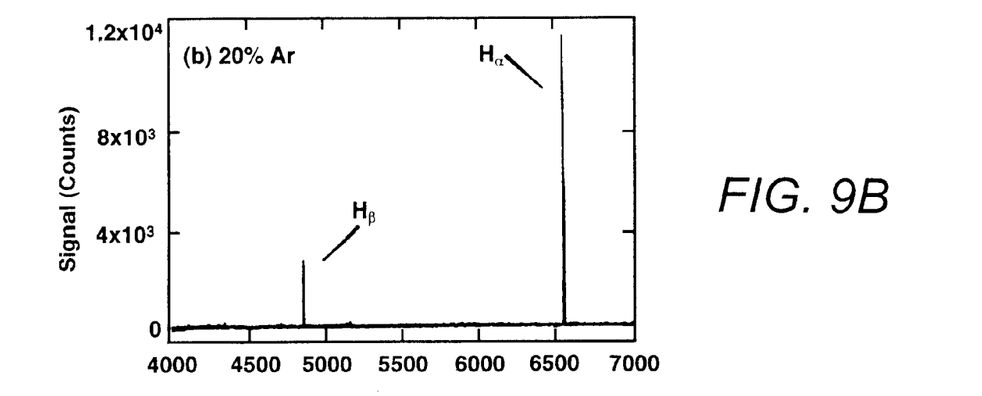
Figure 9C:
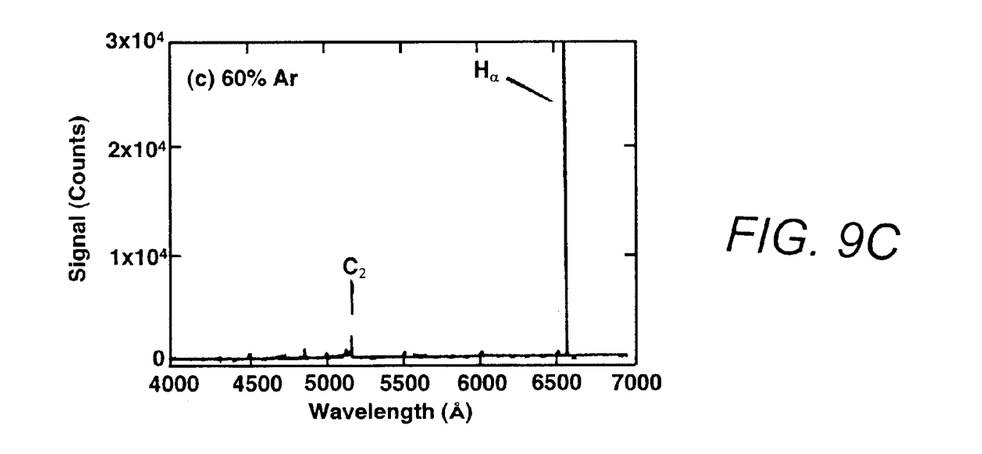
Figure 9D:
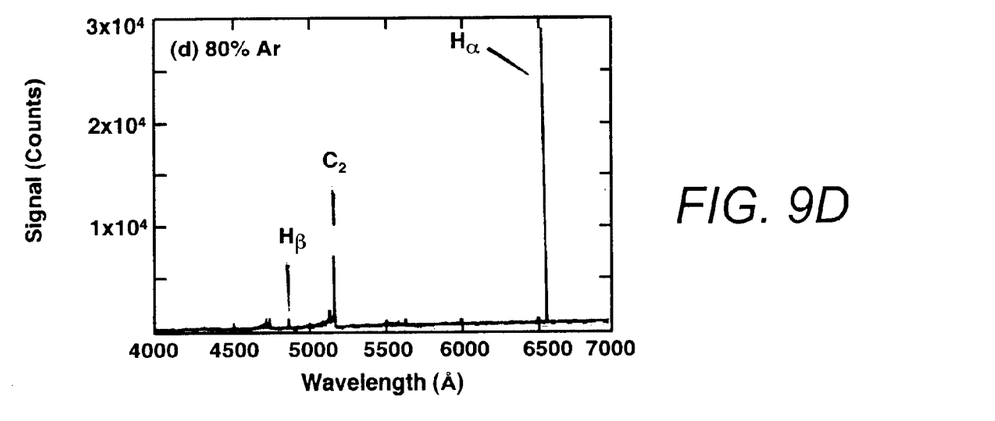
Figure 9E:
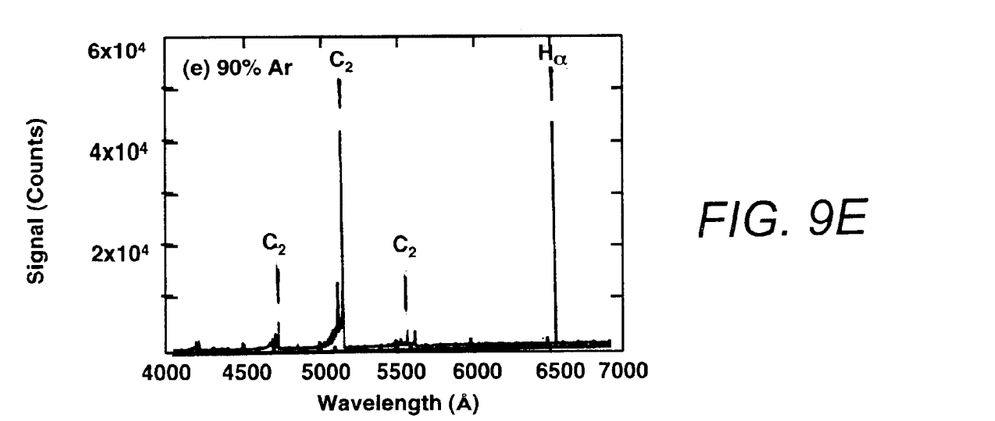
Figure 9F:
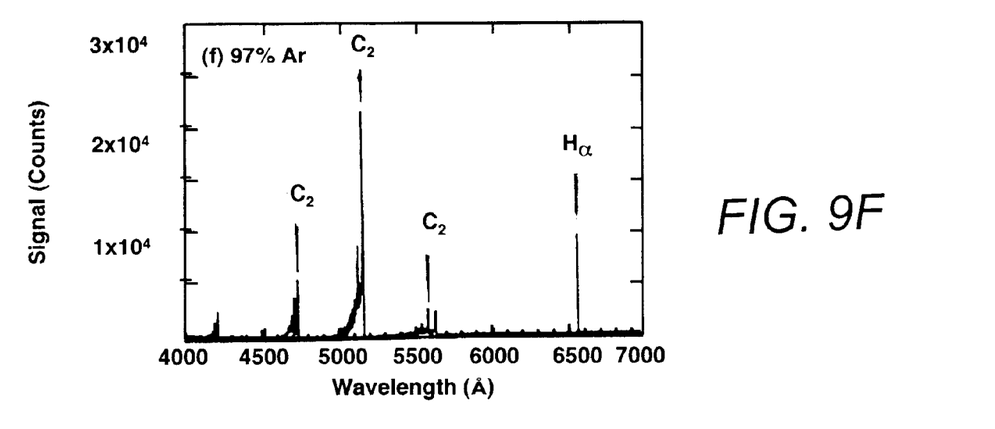
Figure 10:
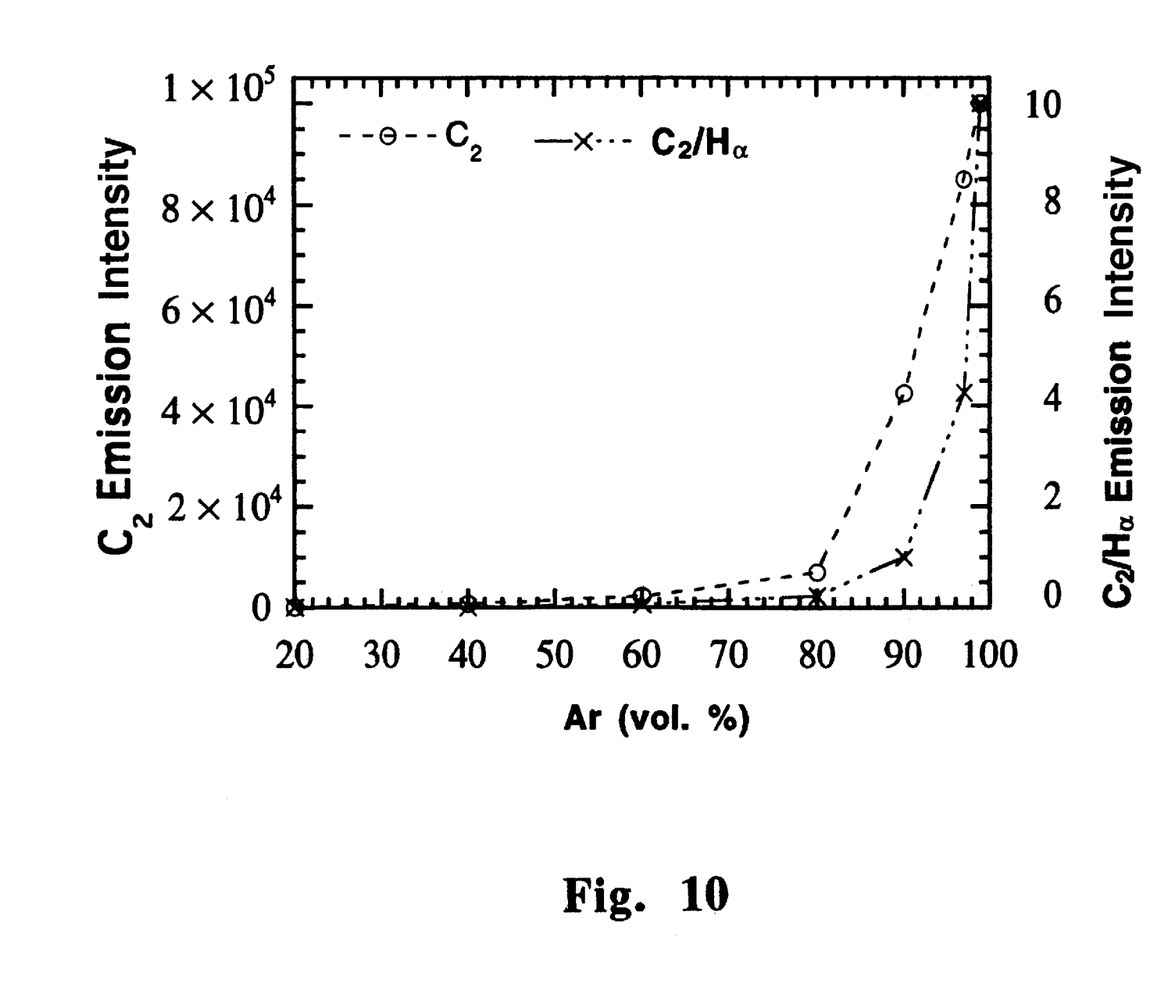
FIG. 10 shows the plots of the emission intensity of $C_2$ and the ratio of the emission intensities of $C_2$ to $H_\alpha$ vs the concentrations of Ar in the reactant gases.

These profound changes in microstructure apparently reflect equally profound changes in the plasma chemistry. Optical emission spectroscopy has been employed to investigate the $Ar/H_2/CH_4$ plasmas in order to monitor $C_2$ dimer and atomic hydrogen concentrations in the microwave discharges. It has earlier been proposed that $C_2$ dimer is the growth species for nanocrystalline diamond. The emission intensities of $C_2$ dimer from the discharges which correlate linearly with the absolute $C_2$ concentration in $Ar/H_2/CH_4$ microwave plasmas, are directly measured using the $C_2$ Swan system (5165 Å bands). FIG. 9 shows the optical emission spectra of plasmas with different ratio of Ar to $H_2$. At 2% Ar the major optical emission peak is due to atomic hydrogen (H). Under these conditions, $CH_3$. is generally believed to be the important growth species, and its concentration has been measured by others in absorption. Increasing the Ar concentration to 20 volume percent, Ha emission is still the major feature (FIG. 9b). At 60 volume % Ar, we begin to observe emission from $C_2$ dimers in addition to Ha (FIG. 9c). Increasing the concentration of Ar increases the emission intensity of $C_2$ dimers (FIGS. 9(d)–9(f)) still further. The emission intensities of $C_2$ and ratios of the emission intensities of $C_2$ to Ha versus volume % Ar are plotted in FIG. 10. both are seen to increase by an order of magnitude in the range 80–97 volume % Ar. This has already been shown to be the region of most profound and rapid change in the microstructure of the diamond films.

Figure 11:
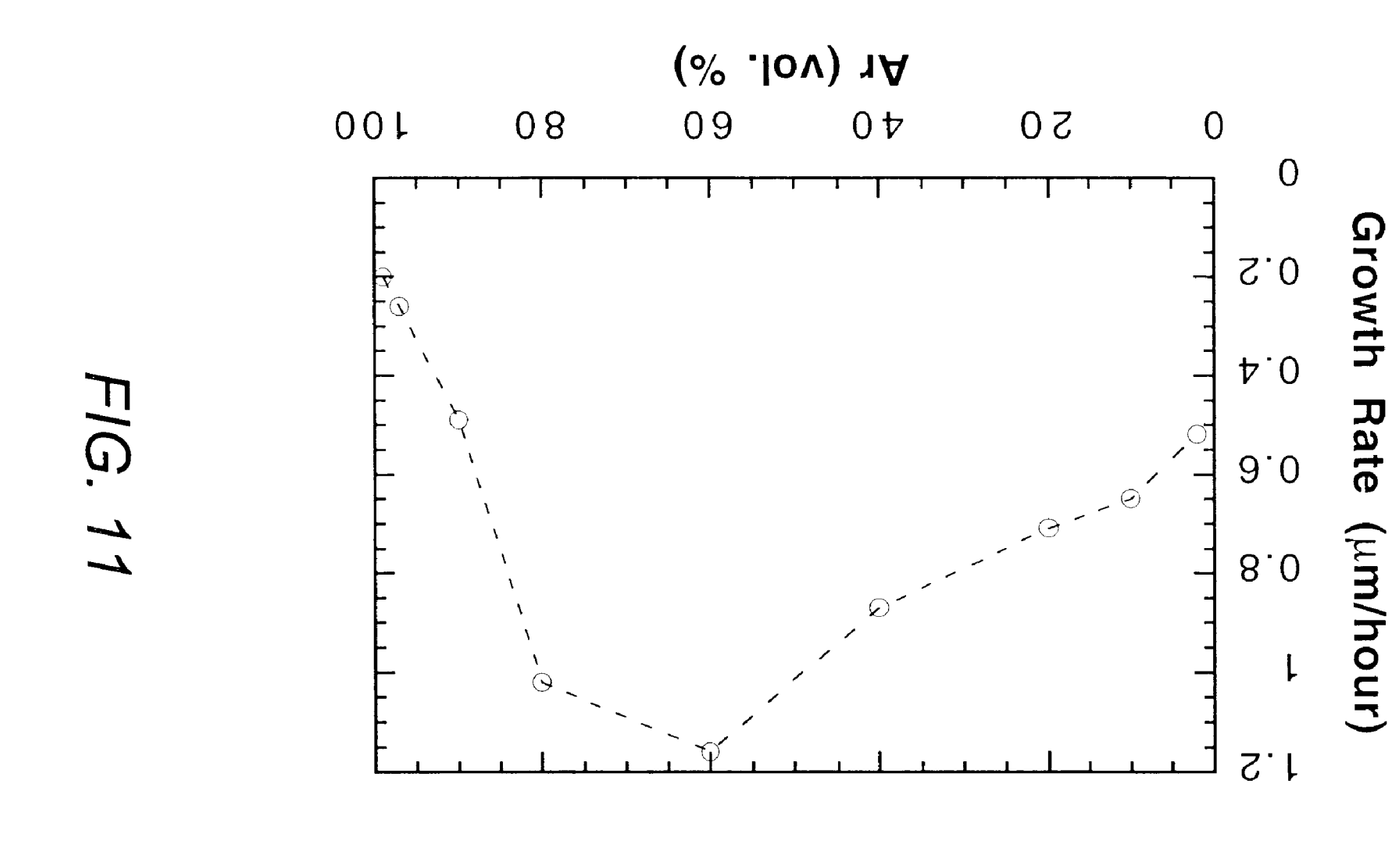
FIG. 11 shows the growth rates of the diamond films from the $Ar/H_2/CH_4$ microwave discharge vs the concentrations of Ar in the reactant gases.

Besides surface morphology, microstructure, and growth mechanism, the growth rate of diamond film has also been found to depend significantly on the ratio of Ar to $H_2$ in the reactant gas presumably because of effects on the microwave discharge chemistry. FIG. 11 shows the growth rates of diamond films grown from 1% $CH_4$ in Ar-$H_2$ mixtures as a function of volume % Ar. The growth rates of the films were determined by monitoring modulations of the surface reflectivity versus deposition time with a He-Ne laser (6328 Å) reflectance interferometer. According to FIG. 11, the growth rate approximately doubles with Ar addition up to 60 volume % Ar and then decreases quite rapidly in the range of 80–97 volume % Ar. Although increasing Ar in the reactant gas from 80 to 99 volume significantly increases the concentration of $C_2$ dimer in the discharge (FIG. 10), the growth rate in this region nonetheless decreases. Theoretical calculations have shown that there is a pathway for the growth of diamond with $C_2$ as the growth species that involves hydrogen addition. This pathway has a lower energy of activation than the alternative pathway that does not involve the intervention of hydrogen, thus rationalizing the effect of hydrogen on the growth rate of nanocrystalline diamond in the range 80–99 volume % Ar.

Figure 12:
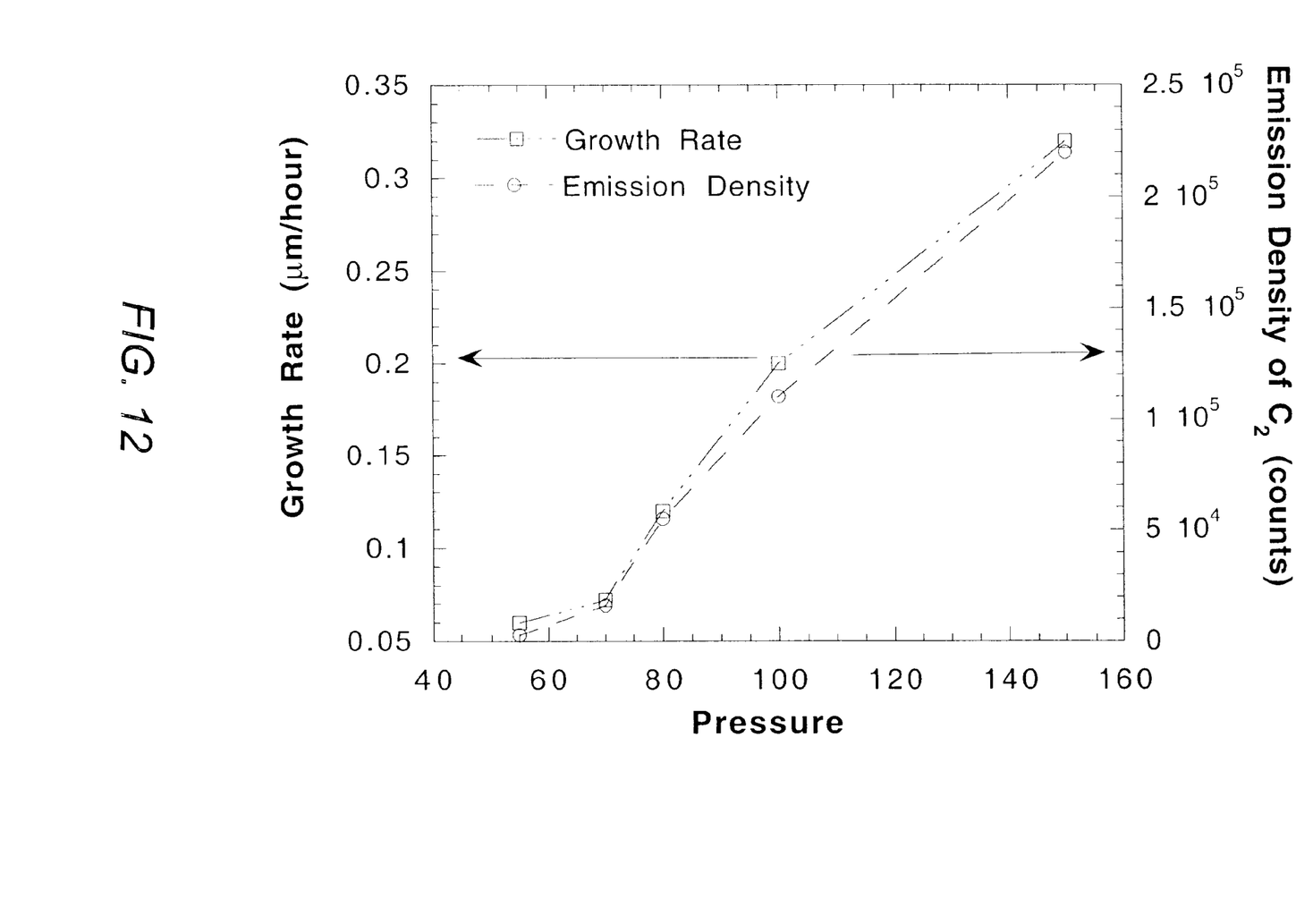
FIG. 12 shows the plots of growth rates of nanocrystalline diamond films grown from $Ar/CH_4$ microwave plasmas and the emission intensities of $C_2$ vs reactant gas pressures for the discharges.

We investigated the effect of the $C_2$ concentration on the growth rate under the condition of constant hydrogen concentration. The reactant gas for this investigation was $Ar/CH_4$ without the addition of molecular hydrogen. The total pressure of the reactant gas was varied, but the ratio of Ar to $CH_4$ was fixed. FIG. 12 shows plots of the growth rates of nanocrystalline diamond films and emission intensities of $C_2$ from the $Ar/CH_4$ plasmas versus reactant gas pressures ranging from 55 to 150 Torr. We determined that pressure strongly affects both the $C_2$ concentration and film growth rate. When the reactant gas pressure was below 40 Torr, no $C_2$ emission was detected, and no diamond film deposition was observed. Similarly, diamond film growth was not observed from $Ar/CH_4$ plasmas up to 15 Torr. At 55 Torr, there was a very low emission intensity of $C_2$, accompanied by a correspondingly low growth rate of about 0.06 μm/h. As the reactant gas pressure increased, both the emission intensity of the $C_2$ dimers and the growth rate of the nanocrystalline films are increased significantly (FIG. 12). The close relationship between the growth rate and the $C_2$ concentration shown in FIG. 12 suggests that the concentration of $C_2$ in the $Ar/CH_4$ plasma is the factor determining the film growth rate under conditions of low and constant $H_2$ concentration. Our observations demonstrate that the reactant gas pressure plays an important role in enhancing the intensity an d therefore the concentration of $C_2$ in $Ar/CH_4$ plasma. That $C_2$ is the growth species for nanocrystalline diamond is confirmed by the functional relationship between the $C_2$ concentration and the growth rate.

The growth of diamond films from $Ar/H_2/CH_4$ microwave discharges has been studied systematically. We have found a new way to control the surface morphology, grain size, and growth mechanism of diamond films by changing the ratio of Ar to $H_2$ in the reactant gases in a systematic way. Based on SEM plan-view images of the films, it has been demonstrated that a transition from microcrystalline to nanocrystalline diamond occurs in the range from 2 to 97 volume % Ar. Cross-section SEM shows that the microcrystalline diamond films grown from the microwave discharges have columnar growth, while the fracture surfaces of the nanocrystalline diamond films are very smooth, thus suggesting a different growth mechanism. This transition from microdiamond to nanodiamond with an increase of the Ar concentration in the reactant gas has been further confirmed by XRD and Raman spectroscopy. TEM and EELS characterization demonstrates the nanocrystalline nature of the films grown from $Ar/H_2/CH_4$ microwave plasmas with an Ar concentration in the 80–97 volume %. The grain sizes of the nanodiamond range from 3 to 50 nm, depending on the ratio of Ar to $H_2$ in the reactant gas. The surface roughness of the films is strongly affected by the microstructure and the growth mechanism. AFM analysis shows that the surface roughness of the films with the same thicknesses changes from 425 nm for microdiamond to 18 nm for nanodiamond.

An optical emission study of the $Ar/H_2/CH_4$ microwave discharges shows that the ratio of Ar to $H_2$ in the reactant gas strongly affects the discharge chemistry. Increasing the concentration of Ar in the reactant gas significantly promotes the concentration of $C_2$ dimer in the discharge which is important for nanocrystalline growth. By varying the reactant gas ($CH_4/Ar$) pressure from 40 to 150 Torr, a close relationship between the growth rate of the nanocrystalline diamond film and the concentration of $C_2$ dimer in the plasma has been observed, confirming that $C_2$ dimer is the growth species of the nanocrystalline diamond.

While there has been disclosed what is considered to be the preferred embodiment of the present invention, it is understood that various changes in the details may be made without departing from the spirit, or sacrificing any of the advantages of the present invention.

What is claimed is:

1. A method of producing diamond having a crystal size in the range of from about 3 nanometers to about 10 microns in response to a change in the concentrations of hydrogen and inert gas and hydrocarbon in a plasma containing same, comprising establishing a plasma containing hydrogen in the range of from 0 to about 97 volume percent and inert gas in the range of from about 2 to about 99 volume percent and hydrocarbon, and varying the ratio of gases in the plasma such that nanocrystalline diamond is produced when inert gas is present greater than about 80 volume percent and microcrystalline diamond is produced when inert gas is present less than about 80 volume percent.

2. The method of claim 1, wherein the plasma is microwave generated and the concentrations of inert gas and hydrogen are varied in the plasma while the concentration of hydrocarbon is maintained substantially constant.

3. The method of claim 2, wherein the concentration of inert gas in the plasma is varied in the range of from about 2% by volume to about 98% by volume of the plasma.

4. The method of claim 2, wherein the concentration of inert gas in the plasma is varied in the range of from about 40% by volume to about 80% by volume.

5. The method of claim 4, wherein the concentration of inert gas is about 60% by volume.

6. The method of claim 2, wherein the concentration of hydrogen gas in the plasma is varied in the range of from about 1% by volume to about 97% by volume.

7. The method of claim 2, wherein the concentration of hydrocarbon is varied in the range of from about 1% by volume to about 3% by volume.

8. The method of claim 1, wherein the inert gas is selected from the noble gases, nitrogen and mixtures thereof.

9. The method of claim 1, wherein the inert gas is Ar.

10. The method of claim 1, wherein the hydrocarbon is selected from $C_1$ to $C_{70}$ hydrocarbons.

11. The method of claim 1, wherein the hydrocarbon includes methane.

12. The method of claim 1, wherein the inert gas is argon and the hydrocarbon is methane, and the ratio of $Ar/H_2$ is at least 4.

13. The method of claim 12, wherein gas pressure during deposition of the diamond film is maintained above 40 Torr.

14. The method of claim 13, wherein the gas pressure is in range from about 40 Torr to about 150 Torr.

15. The method of claim 13, wherein the gas pressure during deposition of the diamond film is maintained above about 120 Torr.

16. A method of producing diamond having a crystal size in the range of from about 3 nanometers to about 10 microns in response to a change in the concentrations of hydrogen and argon and a non-substituted hydrocarbon, comprising establishing a plasma containing hydrogen in the range of from 0 to about 97 volume percent and argon in the range of from about 2 to about 99 volume percent and a non-substituted hydrocarbon, and varying the ratio of hydrogen and argon in the plasma while maintaining the concentration of the non-substituted hydrocarbon substantially constant such that nanocrystalline diamond is produced when inert gas is present greater than about 80 volume percent and microcrystalline diamond is produced when inert gas is present less than about 80 volume percent, and depositing a diamond film on a suitable substrate with the diamond film having a predetermined morphology.

17. The method of claim 16, wherein the plasma is generated from a DC arc, a plasma jet, an RF discharge or a microwave.

18. The method of claim 16, wherein ratio of $Ar/H_2$ is at least 4.

19. The method of claim 18, wherein the hydrocarbon is selected from the $C_1$ to $C_{70}$ hydrocarbons.

20. The method of claim 19, wherein the hydrocarbon is essentially $CH_4$.

21. The method of claim 19, wherein the hydrocarbon is $CH_4$.

22. The method of claim 16, wherein ratio of $Ar/H_2$ is not less than about 9.

23. The method of claim 16, wherein the hydrocarbon concentration is maintained in the range of from about 1% by volume to about 3% by volume.

24. The method of claim 23, wherein the gas pressure during deposition of the diamond film is maintained above about 120 Torr.

25. The method of claim 16, wherein the argon concentration is maintained in the range of from about 40% by volume to about 80% by volume.

26. A method of producing diamond films having a crystal size in the range of from about 3 nanometers to about 10 microns in response to a change in the concentrations of hydrogen and inert gas and an unsubstituted hydrocarbon and controlling the rate of growth of the films, comprising establishing a plasma at a pressure in excess of 55 Torr containing hydrogen in the range of from 0 to about 97 volume percent and inert gas in the range of from about 2 to about 99 volume percent and unsubstituted hydrocarbon up to about 3 volume percent, and maintaining the volume ratio of inert gas to hydrogen greater than about 4 in the plasma such that nanocrystalline diamond is produced when inert gas is present greater than about 80 volume percent and microcrystalline diamond is produced when inert gas is present less than about 80 volume percent and at a predetermined growth rate.

27. The method of claim 26, wherein the plasma is generated by microwave energy.

28. The method of claim 27, wherein the noble gas is Ar.

29. The method of claim 28, wherein the pressure is maintained above about 120 Torr during diamond deposition.

30. The method of claim 29, wherein the volume ratio of inert gas to hydrogen is maintained at not less than about 9.

31. A method of controlling the crystallite size of plasma-deposited diamond films, comprising establishing a plasma containing controlled concentrations of hydrogen, inert gas and a non-substituted hydrocarbon, controlling the ratio of inert gas to hydrogen while maintaining the concentration of hydrocarbon substantially constant, depositing a diamond film on a suitable substrate with the diamond film having a predetermined morphology; wherein the inert gas is present at a concentration in the range of from about 80% by volume to about 98% by volume.

32. The method of claim 31, wherein the inert gas is argon.

33. The method of claim 31 and further including the presence of nitrogen, wherein the total concentration of argon and nitrogen is in the range of from about 80% by volume to about 98% by volume.

* * * * *